United States Patent
Jiang et al.

(10) Patent No.: US 8,362,458 B2
(45) Date of Patent: Jan. 29, 2013

(54) NITIRDE SEMICONDUCTOR LIGHT EMITTING DIODE

(75) Inventors: Ren-Hao Jiang, Taichung (TW); Chih-Wei Hu, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 171 days.

(21) Appl. No.: 12/979,274

(22) Filed: Dec. 27, 2010

(65) Prior Publication Data
US 2012/0161099 A1     Jun. 28, 2012

(51) Int. Cl.
  *H01L 33/00*  (2010.01)
(52) U.S. Cl. ...... 257/13; 257/14; 257/156; 257/E33.008
(58) Field of Classification Search ............ 257/13, 257/14, 15, E33.008
See application file for complete search history.

(56) References Cited

U.S. PATENT DOCUMENTS

| | | | |
|---|---|---|---|
| 7,326,963 B2 | 2/2008 | Gaska et al. | |
| 7,368,309 B2 | 5/2008 | Lee | |
| 7,700,940 B2 | 4/2010 | Sakai et al. | |
| 7,727,333 B1 * | 6/2010 | Syrkin et al. | 117/91 |
| 2005/0040426 A1 * | 2/2005 | Edmond et al. | 257/103 |
| 2005/0230688 A1 | 10/2005 | Lee | |
| 2006/0060879 A1 * | 3/2006 | Edmond | 257/99 |
| 2008/0054248 A1 | 3/2008 | Chua et al. | |
| 2008/0093610 A1 | 4/2008 | Lee | |
| 2010/0019225 A1 | 1/2010 | Lee | |
| 2010/0040102 A1 * | 2/2010 | Ahn | 372/45.012 |
| 2010/0108985 A1 | 5/2010 | Chung et al. | |

FOREIGN PATENT DOCUMENTS

| | | |
|---|---|---|
| TW | I251947 | 3/2006 |
| TW | I287880 | 10/2007 |
| TW | I302755 | 11/2008 |
| TW | 200910655 | 3/2009 |

OTHER PUBLICATIONS

Martin F. Schubert et al, "Polarization-matched GaInN/AlGaIn multi-quantum-well light-emitting diodes with reduced efficiency droop", Applied Physics Letters 93, 2008 American Institute of Physics, published online Jul. 28, 2008. p. 041102-1-p. 041102-3.

Min-Ho Kim et al, "Partial Polarization Matching in GaInN-Based Multiple Quantum Well Blue LEDs Using Ternary GaInN Barriers for a Reduced Efficiency Droop", IEEE Journal of Selected Topics in Quantum Electronics, issued on Jul.-Aug. 2009, p. 1-p. 6.

Sung-Nam Lee et al, "High-Power GaN-based blue violate laser diodes with AlGan/Gan multiquantum barriers", Applied Physics Letters 88, published online Mar. 13, 2006, American Institute of Physics, 111101(2006), p. 11101-1-p. 111101-3.

Jianping Zhang et al, "Enhanced luminescence in InGan multiple quantum wells with quaternary alInGaN barriers", Applied Physics Letters vol. 77, No. 17, issued on Oct. 23, 2000. p. 2668-p. 2670.

(Continued)

*Primary Examiner* — Victor A Mandala
(74) *Attorney, Agent, or Firm* — Jianq Chyun IP Office

(57) ABSTRACT

A nitride semiconductor LED device including an N-type doped layer, an active layer and a P-type doped layer is provided. The active layer is disposed on the N-type doped layer and includes at least one quantum well structure. The quantum well structure includes two quantum barrier layers and a quantum well sandwiched between the quantum barrier layers. The quantum barrier layer is a super-lattice structure including a quaternary nitride semiconductor. The P-type doped layer is disposed on the active layer.

16 Claims, 7 Drawing Sheets

OTHER PUBLICATIONS

Chia-Lung Tsai et al, "Enhanced Luminescence of InGaN Light Emitting Diodes with Strain-Compensated Superlattice Barriers", Journal of the Electrochemical Society 157, Published on Jan. 4, 2010, pH260-pH263.

Aumer et al., "Effects of tensile and compressive strain on the luminescence properties of AlInGaN/InGaN quantum well structures", Applied Physics Letters, Aug. 7, 2000, pp. 821-823, vol. 77, No. 6.

* cited by examiner

|  | base | Al=6% | Al=9% | Al=12% |
|---|---|---|---|---|
| IQE | 24.99% | 30.05% | 44.71% | 36.08% |

FIG. 2

NITIRDE SEMICONDUCTOR LIGHT EMITTING DIODE

BACKGROUND

1. Field of the Application

The application relates to a semiconductor device and a method of fabricating the same, and more particularly to a nitride semiconductor light emitting diode (LED) and a method of fabricating the same.

2. Description of Related Art

Recently, the demands for photo-electric materials having high efficiency increase greatly with the population in photo-electric technology and related industries. The semiconductor compound material has gradually become the main stream in photo-electric materials for its advantages such as high light emitting efficiency, long life cycle, wide range for adjusting band gap, low cost, and so on. Herein, the nitride semiconductor material is suitable to be adopted as the material with the light emitting wavelengths of blue light to ultraviolet light, and can be applied in color displays, LEDs, high frequency electronic devices, semiconductor lasers, and the like. The nitride semiconductor material is especially adopted in the popular blue light LED devices and thus receives wide attention.

Conventional LED devices include an N-type doped nitride semiconductor layer, an active layer, a P-type doped nitride semiconductor layer, and two metal electrodes formed on a substrate sequentially. Moreover, the two metal electrodes are electrically connected to the N-type doped nitride semiconductor layer and the P-type doped semiconductor layer respectively. The active layer includes, for example, at least two quantum barrier layers and a quantum well located between the quantum barrier layers. A band gap of the quantum barrier layers has to be higher than a band gap of the quantum well to prevent a carrier from escaping after falling into the quantum well, thereby increasing the confinement of the carriers. Generally, the quantum well is fabricated with $In_xGa_{1-x}N$, where x ranges from 0 to 1. The quantum barrier layers are fabricated with materials having lattice constants similar to those of the quantum well (so as to alleviate the piezoelectric effect). Also, a suitable amount of aluminum (Al) is added so that the band gap of the quantum barrier layers is higher than that of the quantum well. For instance, the quantum barrier layers is fabricated with $Al_xGa_yIn_{1-x-y}N$, where x, y range from 0 to 1. However, the large addition of aluminum in the quantum barrier layers lowers the quality of lattices subsequently formed in the quantum wells, thereby resulting in pits. In addition, the large addition of aluminum in the quantum barrier layers increases current leakage and fails to effectively inhibit the piezoelectric effect and enhance the internal quantum efficiency (IQE).

A nitride semiconductor light emitting device is disclosed in U.S. Patent Publication No. US2008/0093619, where a quantum barrier layer in an active region thereof is a multi-layer structure. The quantum barrier layer in the disclosure includes an InGaN layer, an AlInN layer, and an InGaN/GaN super-lattice structure. These structures are capable of forming a superior interface with the P-type doped nitride semiconductor layer and prevent the magnesium (Mg) in the P-type doped nitride semiconductor layer from diffusing into the active layer. In order for the quantum barrier layer containing AlInN and the quantum well to have a sufficient band gap, the aluminum content has to be greater than 15%. However, the above aluminum content does not guarantee a sufficient band gap. Furthermore, the large amount of the aluminum content can not reduce the piezoelectric effect between the quantum well and the quantum barrier layer effectively.

SUMMARY

The application provides a nitride semiconductor light emitting diode (LED) device. A quantum barrier layer thereof is a super-lattice structure including a quaternary nitride semiconductor. The quantum barrier layer is capable of releasing the strain of an active layer, such that the piezoelectric effect can be inhibited effectively.

The application provides a nitride semiconductor LED device including an N-type doped nitride semiconductor layer, an active layer, and a P-type doped nitride semiconductor layer. The active layer is disposed on the N-type doped nitride semiconductor layer and includes at least one quantum well structure. The quantum well structure includes two quantum barrier layers and a quantum well sandwiched between the quantum barrier layers. At least one of the quantum barrier layers is a super-lattice structure including a quaternary nitride semiconductor. The super-lattice structure is constituted by an $Al_aIn_bGa_{1-a-b}N$ layer and an $In_eGa_{1-e}N$ layer which are periodically stacked. Herein, $0.01 \leq a \leq 0.5$ and a+b<1. The P-type doped nitride semiconductor layer is disposed on the active layer.

The application further provides a nitride semiconductor LED device including an N-type doped nitride semiconductor layer, an active layer, and a P-type doped nitride semiconductor layer. The active layer is disposed on the N-type doped nitride semiconductor layer and includes at least one quantum well structure. The quantum well structure includes two quantum barrier layers and a quantum well sandwiched between the quantum barrier layers. At least one of the quantum barrier layers is a super-lattice structure including a quaternary nitride semiconductor. The super-lattice structure is constituted by an $Al_aIn_bGa_{1-a-b}N$ layer and an $In_eGa_{1-e}N$ layer which are periodically stacked. Herein, $0.03 \leq a \leq 0.15$ and a+b<1. The P-type doped nitride semiconductor layer is disposed on the active layer.

The application further provides a nitride semiconductor LED device including an N-type doped nitride semiconductor layer, an active layer, and a P-type doped nitride semiconductor layer. The active layer is disposed on the N-type doped nitride semiconductor layer and includes at least one quantum well structure. The quantum well structure includes two quantum barrier layers and a quantum well sandwiched between the quantum barrier layers. At least one of the quantum barrier layers is a super-lattice structure including a quaternary nitride semiconductor. The super-lattice structure is constituted by an $Al_aIn_bGa_{1-a-b}N$ layer and an $In_eGa_{1-e}N$ layer which are periodically stacked. Herein, $0.08 \leq a \leq 0.095$ and a+b<1. The P-type doped nitride semiconductor layer is disposed on the active layer.

In light of the foregoing, the quantum barrier layer having a super-lattice structure including the quaternary nitride semiconductor facilitates to release the strain of the active layer. Consequently, the piezoelectric effect can be inhibited effectively, the quality of the lattices subsequently formed in the quantum well can be enhanced, and the occurrence of current leakage can be reduced.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 2 is a diagram showing a relationship between internal quantum efficiency and aluminum content (a values) of an $Al_aIn_bGa_{1-a-b}N$ layer in a quantum barrier layer.

DESCRIPTION OF EMBODIMENTS

Figure 1A:
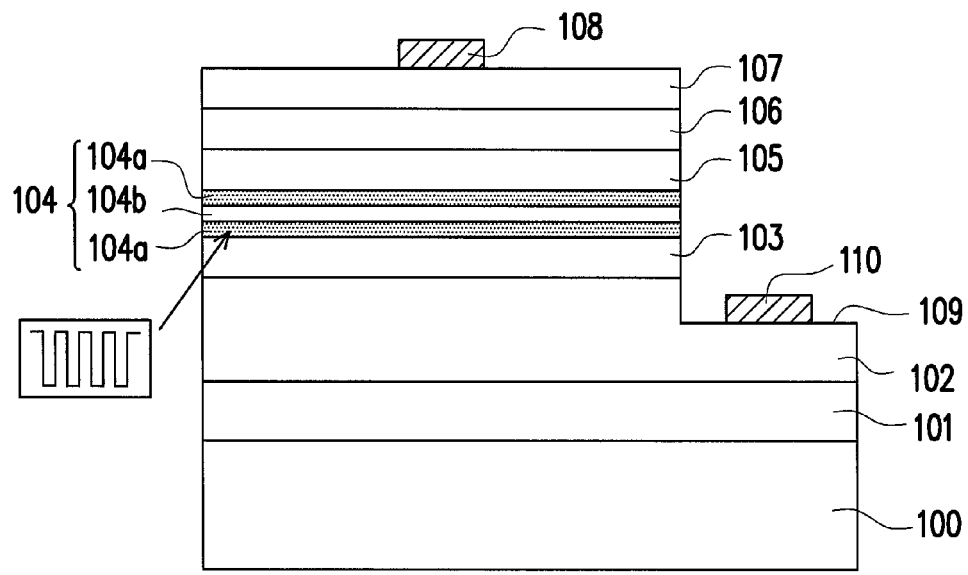
FIG. 1A is a schematic cross-sectional view illustrating a nitride semiconductor light emitting diode (LED) according to a first embodiment, and a band distribution diagram of quantum barrier layers is shown on the left.

FIG. 1A is a schematic cross-sectional view illustrating a nitride semiconductor light emitting diode (LED) according to a first embodiment. Referring to FIG. 1A, firstly, a substrate 100 is provided. The substrate 100 is fabricated with, for instance, sapphire, silicon (Si), silicon carbide (SiC), zinc oxide (ZnO), gallium nitride (GaN), or other suitable material for epitaxy. Next, an N-type doped nitride semiconductor layer 102 is formed on one surface of the substrate 100. The N-type doped nitride semiconductor layer 102 is, for instance, GaN doped with silicon or germanium. A method of forming the N-type doped nitride semiconductor layer 102 includes performing a metal organic chemical vapor deposition (MOVCD), for example. In the present embodiment, the N-type doped nitride semiconductor layer 102 has, for example, a region 109 for subsequently forming a second electrode 110.

In the present embodiment, a buffer layer 101 can also be formed on the substrate 100 for reducing the lattice mismatch therebetween before the N-type doped nitride semiconductor layer 102 is formed. The buffer layer 101 is fabricated using, for example, gallium nitride (GaN), aluminum gallium nitride (AlGaN), silicon carbonite (SiC), zinc oxide (ZnO), zinc tellurium oxide (ZnTeO), or magnesium nitride (MgN). The material used to fabricate the buffer layer 101 is determined according to the substrate material and the present embodiment does not limit the material thereof.

An active layer 104 and a P-type doped nitride semiconductor layer 106 is formed on the N-type doped nitride semiconductor layer 102 subsequently. The thickness of the active layer 104 ranges from about 3 nm to about 500 nm, for example. The active layer 104, functioning as a light emitting layer, includes at least one quantum well structure. As shown in FIG. 1A, the quantum well structure includes a quantum well 104b sandwiched between two quantum barrier layers 104a. As the electrical current passes through the active layer 104, electrons from N-type doped nitride semiconductor layer 102 combine in the active layer 104 with holes from P-type doped nitride semiconductor layer 106, which causes the active layer 104 to generate light.

The quantum barrier layer 104a in the present embodiment is a super-lattice structure including a quaternary nitride semiconductor. In details, the super-lattice structure of the quantum barrier layer 104a can be alternating layers formed from binary, ternary, or quaternary variations of $Al_xIn_yGa_{1-x-y}N$ ($0 \leq x$, $y \leq 1$, $x+y<1$) grown on the N-type doped nitride semiconductor layer 102. For example, the super-lattice structure of the quantum barrier layer 104a is constituted by a periodic stack of an $Al_aIn_bGa_{1-a-b}N$ layer and an $Al_cIn_dGa_{1-c-d}N$, a periodic stack of an $Al_aIn_bGa_{1-a-b}N$ layer and an $In_eGa_{1-e}N$ layer, a periodic stack of an $Al_aIn_bGa_{1-a-b}N$ layer and a GaN layer, or a periodic stack of an $Al_aIn_bGa_{1-a-b}N$ layer, an $In_eGa_{1-e}N$ layer and a GaN layer. Here, a, b, c, d, e respectively range from 0 to 1, a+b<1, c+d<1, and a does not equal to c, b does not equal to d. The number of layers in the periodically stacked super-lattice structure is at least two pairs (that is, 4 layers) and the thickness of each of the layers, for instance, ranges from about 0.5 nm to about 50 nm. A band diagram of the quantum barrier layer 104a is shown on the left side of FIG. 1A. As the quantum barrier layer 104a is a super-lattice structure formed with at least two layers periodically stacked, the band diagram thereof shows a periodic variation. The thickness of the quantum barrier layer 104a is determined by the number and thickness of the layers that are periodically stacked in the super-lattice structure.

When the super-lattice structure of the quantum barrier layer 104a is constituted by an $Al_aIn_bGa_{1-a-b}N$ layer and an $In_eGa_{1-e}N$ layer that are periodically stacked, at least two pairs (that is, four layers) are present and the thickness of each layer ranges from about 0.5 nm to about 50 nm, for example. Additionally, when the super-lattice structure of the quantum barrier layer 104a is constituted by an $Al_aIn_bGa_{1-a-b}N$ layer and an $In_eGa_{1-e}N$ layer that are periodically stacked, then a ranges from, for instance, $0.01 \leq a \leq 0.5$; preferably $0.03 \leq a \leq 0.15$; or more preferably $0.08 \leq a \leq 0.095$. Considering the lattice mismatch and energy gap with adjacent quantum wells, b has to satisfy the correlation of, for example, $0.015 \leq b \leq 0.15$. Similarly, e has to satisfy the correlation of, for example, $0.05 \leq e \leq 0.07$.

Further, the quantum well 104b is fabricated with, for example, $In_fGa_{1-f}N$ or $Al_nGa_pIn_{1-n-p}N$, where f, n, p respectively range from 0 to 1 and n+p<1. For example, f ranges from 0.1 to 0.5. The thickness of the quantum well 104b ranges from about 1 nm to about 20 nm, for example. Moreover, the quantum barrier layers 104a and the quantum well 104b are formed as follows. For instance, a metal organic chemical vapor deposition (MOCVD) or a molecular-beam epitaxy (MBE) is performed, where the growth temperature thereof ranges from about 600° C. to about 900° C.

In one embodiment, the quantum barrier layer 104a is, for example, a super-lattice structure formed by an $Al_aIn_bGa_{1-a-b}N$ layer and an $In_eGa_{1-e}N$ layer that are periodically stacked, and the quantum well 104b is fabricated using $In_fGa_{1-f}N$, for instance. Firstly, a MOCVD or a MBE is performed to form an $In_eGa_{1-e}N$ layer on the N-type doped nitride semiconductor layer 102 with a growth temperature ranging from 600° C. to 900° C. An $Al_aIn_bGa_{1-a-b}N$ layer is then formed on a surface of the $In_eGa_{1-e}N$ layer under 700° C. to 900° C. Afterwards, the quantum barrier layer 104a having the superlattice structure is formed by periodic stack (at least two pairs). The quantum well 104b fabricated with $In_fGa_{1-f}N$ is formed on a surface of the quantum barrier layer 104a under 600° C. to 900° C. Subsequently, another quantum barrier layer 104a is fabricated on the quantum well 104b using the above method so as to form the active layer 104 having a single quantum well structure.

Since the quantum barrier layer 104a in the present embodiment is the super-lattice structure including the quaternary nitride semiconductor, the requirement for the band gap of the quantum barrier layer to be at least 0.2 eV higher than the band gap of the quantum well is satisfied. In addition, the strain of the active layer 104 is released to reduce the piezoelectric effect effectively. Also, the quantum barrier layer 104a in the present embodiment improves the crystal quality of the subsequently formed quantum well 104b, and reduces the generation of the pits, thereby reducing the occurrence of current leakage and enhancing internal quantum efficiency.

In one embodiment, before the active layer 104 is formed, a strain release layer 103 is optionally formed between the N-type doped nitride semiconductor layer 102 and the active layer 104. The strain release layer 103 is adopted to release the strain of the active layer 104. The strain release layer 103 is, for example, a stacked structure constituted by an $In_mGa_{1-m}N$ layer and a GaN layer, where m ranges from 0.01 to 0.3. The thickness of each of the $In_mGa_{1-m}N$ layers and the GaN layers respectively ranges from about 1 nm to about 50 nm, for example. Additionally, the strain release layer 103 is formed by, for example, performing a MOCVD.

Referring to FIG. 1A, later, a P-type doped nitride semiconductor layer 106 is formed on the active layer 104. The P-type doped nitride semiconductor layer 106 is fabricated using, for instance, GaN doped with magnesium or zinc. A method of forming the P-type doped nitride semiconductor layer 106 includes performing a MOVCD, for example. In one embodiment, before the P-type doped nitride semiconductor layer 106 is formed, an electron blocking layer 105 can also be formed between the active layer 104 and the P-type doped nitride semiconductor layer 106. The electron blocking layer 105 further reduces the escape of electrons from the active layer 104. Therefore, the band gap of the electron blocking layer 105 is higher than that of the quantum barrier layer 104a. The electron blocking layer 105 is a super-lattice structure constituted by an AlGaN layer or stacked by an AlGaN layer and a GaN layer, for instance. For example, the electron blocking layer 105 is a super-lattice structure constituted by 5 to 8 pairs of the AlGaN layers and the GaN layers. The thickness of each of the AlGaN layers and the GaN layers, for instance, ranges from about 18 nm to about 25 nm respectively and an aluminum content in the AlGaN layer ranges from 0.2 to 0.35.

Subsequently, a first electrode 108 is formed on the P-type doped nitride semiconductor layer 106. The first electrode 108 is fabricated with chromium gold (Cr/Au), for example. In one embodiment, before the first electrode 108 is formed, a P-type ohmic contact layer 107 is optionally formed between the P-type doped nitride semiconductor layer 106 and the first electrode 108. The P-type ohmic contact layer 107 is adopted for reducing a resistance between the P-type doped nitride semiconductor layer 106 and the first electrode 108. The P-type ohmic contact layer 107 is fabricated using, for instance, nickel gold stacked layer, indium tin oxide, or zinc oxide.

Figure 1B:
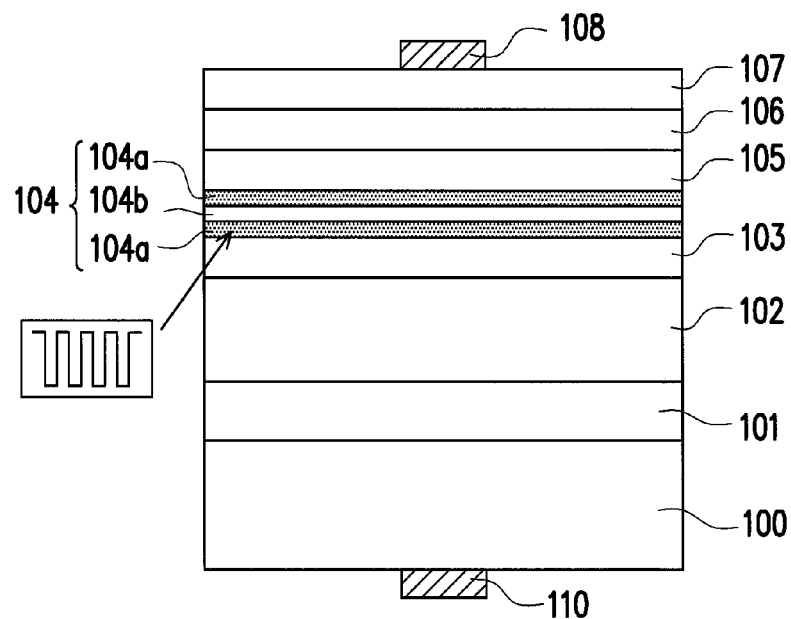
FIG. 1B is a schematic cross-sectional view illustrating another nitride semiconductor LED according to the first embodiment, and a band distribution diagram of quantum barrier layers is shown on the left.

Afterwards, a second electrode 110 is formed on the region 109 exposed by the N-type doped nitride semiconductor layer 102. The second electrode 110 is fabricated using titanium/aluminum/titanium/gold (Ti/Al/Ti/Au), for example. Up to this point, the fabrication of the nitride semiconductor LED device in the first embodiment is complete. It should be illustrated that when the substrate 100 is fabricated with a conductive material such as GaN or Si, the second electrode 110 can also be formed on the other side of the substrate 100 as shown in FIG. 1B. Thus, the N-type doped nitride semiconductor layer 102 does not need to form the region 109 for disposing the second electrode 110.

Next, the structure of the nitride semiconductor LED device in the first embodiment is explained. Referring to FIGS. 1A and 1B, a nitride semiconductor LED device in the present embodiment includes the substrate 100, the N-type doped nitride semiconductor layer 102, the active layer 104, the P-type doped nitride semiconductor layer 106, the first electrode 108, and the second electrode 110. The N-type doped nitride semiconductor layer 102 is disposed on one surface of the substrate 100. The active layer 104 is disposed on the N-type doped nitride semiconductor layer 102 and includes at least one quantum well structure. The quantum well structure includes two quantum barrier layers 104a sandwich a quantum well 104b The quantum barrier layer 104a is a super-lattice structure including a quaternary nitride semiconductor. The P-type doped nitride semiconductor layer 106 is disposed on the active layer 104. The first electrode 108 is disposed on the P-type doped nitride semiconductor layer 106. The second electrode 110 is disposed on the region 109 exposed by the N-type doped nitride semiconductor layer 102 or on the other side of the substrate 100. In addition, the buffer layer 101 is located between the substrate 100 and the N-type doped nitride semiconductor layer 102 so as to reduce the lattice mismatch therebetween. The strain release layer 103 is located between the N-type doped nitride semiconductor layer 102 and the active layer 104 for releasing the strain of the active layer 104. The electron blocking layer 105 is located between the active layer 104 and the P-type doped nitride semiconductor layer 106 so as to further reduce the escape of electrons from the active layer 104. The P-type ohmic contact layer 107 is located between the P-type doped nitride semiconductor layer 106 and the first electrode 108 so as to reduce the resistance between the P-type doped nitride semiconductor layer 106 and the first electrode 108.

Figure 1C:
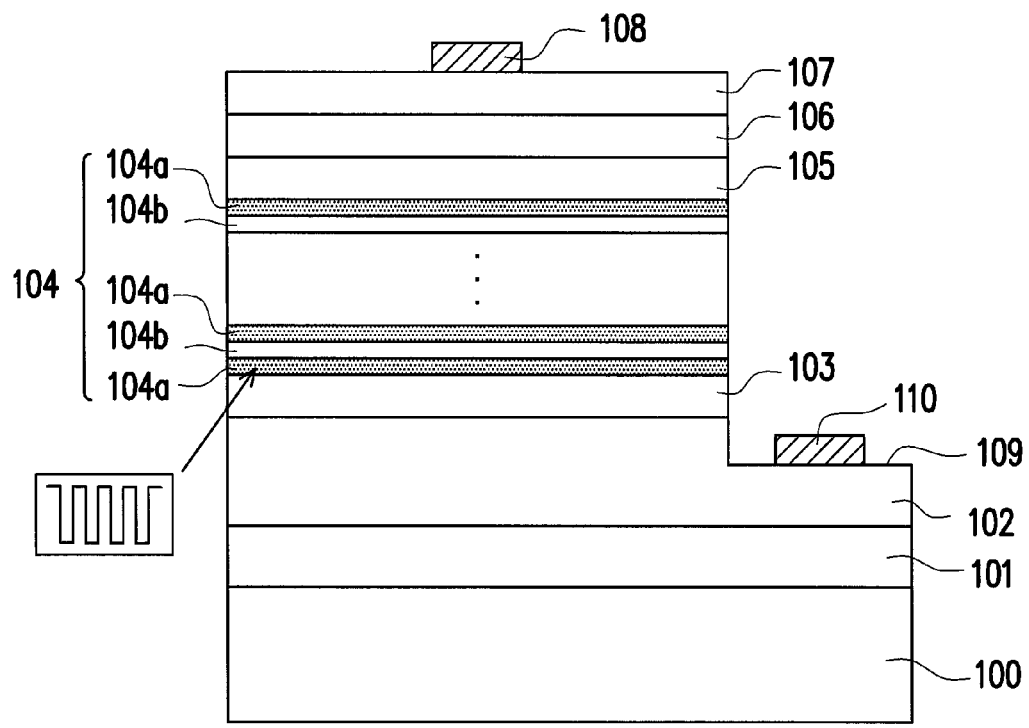
FIG. 1C is a schematic cross-sectional view illustrating another nitride semiconductor LED according to the first embodiment, and a band distribution diagram of quantum barrier layers is shown on the left.
Figure 1D:
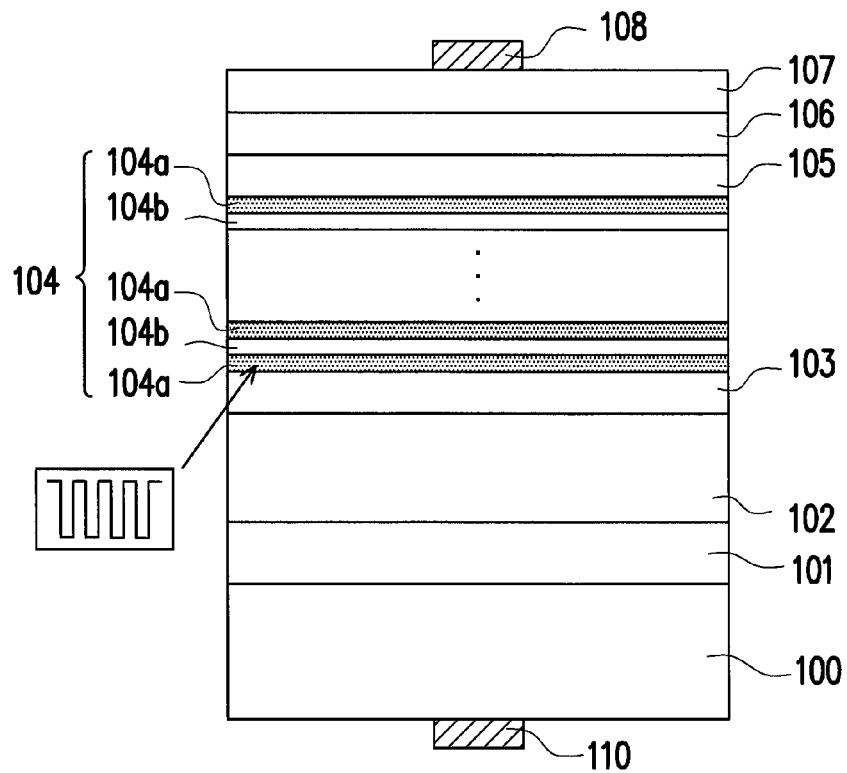
FIG. 1D is a schematic cross-sectional view illustrating another nitride semiconductor LED according to the first embodiment, and a band distribution diagram of quantum barrier layers is shown on the left.

In the above embodiments, the active layer including a single quantum well structure is used as an example for illustrate. However, the application is not limited thereto. Persons skilled in the art should understand that the active layer in the present embodiment can also be a multiple quantum well structure. In other words, the active layer in the present embodiment also includes a plurality of quantum well structure, where at least two pairs of quantum barrier layers 104a and the quantum well 104b are stacked on the strain release layer 103 alternately as depicted in FIGS. 1C and 1D.

Experimental Embodiment

Figure 2:
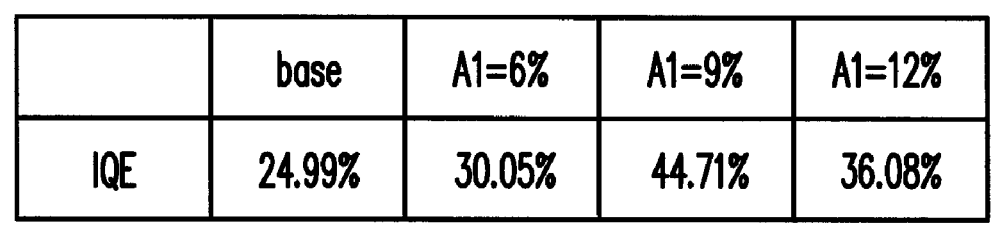

FIG. 2 is a diagram showing a relationship between internal quantum efficiency and aluminum content (a values) of an $Al_aIn_bGa_{1-a-b}N$ layer in a quantum barrier layer. Referring to FIG. 2, when the super-lattice structure of the quantum barrier layer is constituted by an $Al_aIn_bGa_{1-a-b}N$ layer and an $In_eGa_{1-e}N$ layer that are periodically stacked and the aluminum contents thereof are respectively 6%, 9%, 12%, the internal quantum efficiencies of the nitride semiconductor LED device are respectively 30.05% (aluminum content is 6%), 44.71% (aluminum content is 9%), 36.08% (aluminum content is 12%). In FIG. 2, the base means that when the quantum barrier layer is constituted by a single layer of GaN, that is, the aluminum and the indium contents are both 0, the internal quantum efficiency of the nitride semiconductor LED device is 24.99%. Obviously, when the $Al_aIn_bGa_{1-a-b}N/In_eGa_{1-e}N$ super-lattice structure is adopted as the quantum barrier layer, the internal quantum efficiency of the nitride semiconductor LED device is greatly enhanced.

It should be noted that when the aluminum content in the $Al_aIn_bGa_{1-a-b}N$ layer is around 9% (that is a=0.09), the nitride semiconductor LED device has a higher internal quantum efficiency. Specifically, when a=0.09 in the $Al_aIn_bGa_{1-a-b}N$ layer, the strain is most efficiently released, so that the piezoelectric field is reduced, thereby enhancing the internal quantum efficiency of the nitride semiconductor LED device.

Figure 3A:
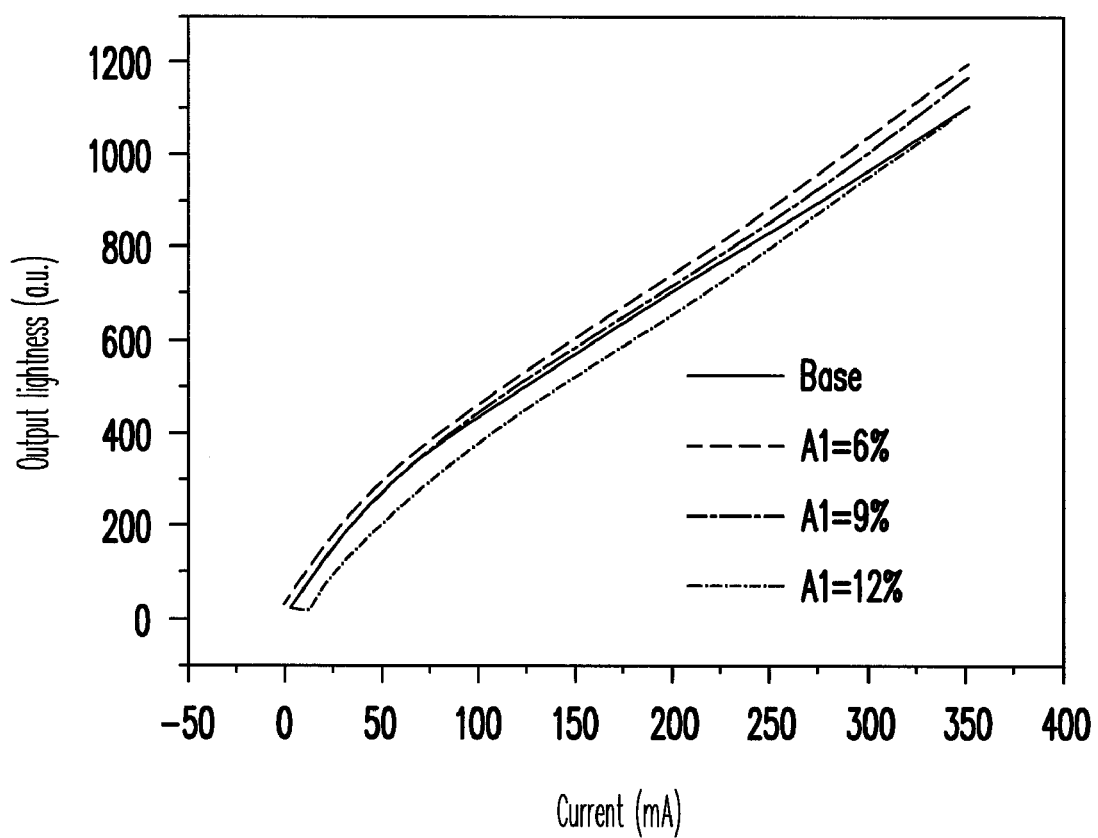
FIG. 3A shows a diagram depicting a relationship between output lightness corresponding to different aluminum contents (a values) and current.
Figure 3B:
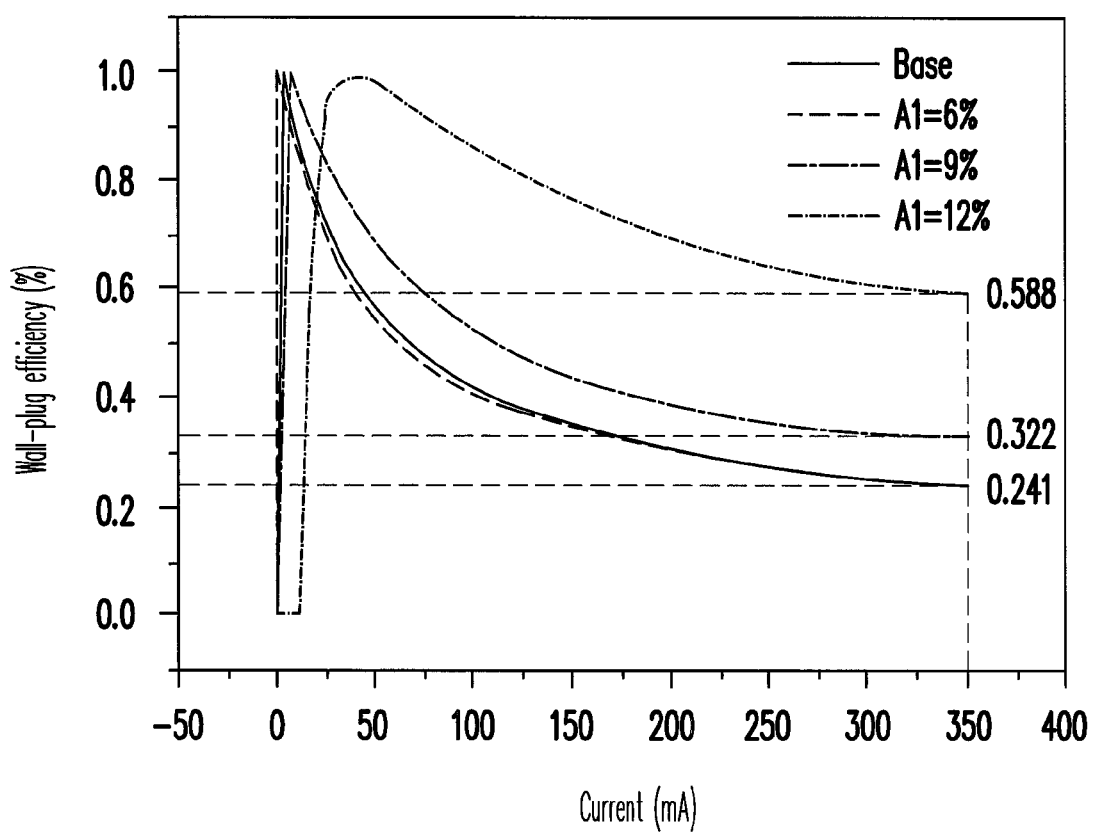
FIG. 3B shows a diagram depicting a relationship between wall-plug efficiency corresponding to different aluminum contents (a values) and current.
Figure 3C:
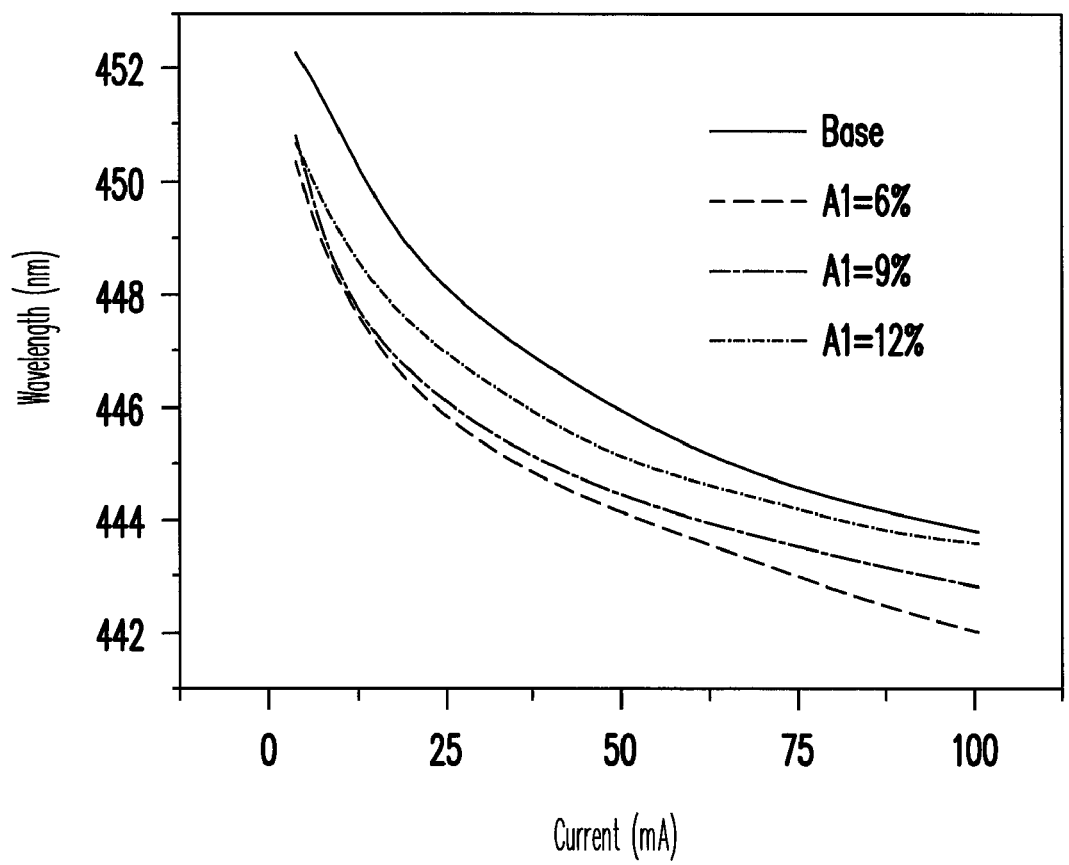
FIG. 3C shows a diagram depicting a relationship between wavelength corresponding to different aluminum contents (a values) and current.

FIG. 3A shows a diagram depicting a relationship between output power corresponding to different aluminum contents (a values) and operating current. FIG. 3B shows a diagram depicting a relationship between wall-plug efficiency corresponding to different aluminum contents (a values) and operating current. FIG. 3C shows a diagram depicting a relationship between wavelength corresponding to different aluminum contents (a values) and operating current.

Referring to FIG. 3A, when the operating current is 350 mA and a equals to 0.06, 0.09, and 0.12, comparing to an output power 1099 (a.u.) of the quantum barrier layer constituted by a single layer of GaN (that is, the base), the output power of the nitride semiconductor LED device (a=0.06 and 0.09) are respectively 1192 (a.u.) and 1167 (a.u.), which have increased about 6% and about 8.5% respectively. When a=0.12, the output power of the nitride semiconductor LED device is 1107 (a.u.) and an increased range is about 0.7%.

Referring to FIG. 3B, when the operating current is 350 mA and a equals to 0.06, 0.09, 0.12 respectively, the wall-plug efficiencies of the nitride semiconductor LED device are 24.1% (aluminum content is 6%), 32.2% (aluminum content is 9%), 58.8% (aluminum content is 12%) respectively. When the operating current is 350 mA, if the quantum barrier layer is constituted by a single layer of GaN (that is, the base), the wall-plug efficiency of the nitride semiconductor LED device is 23.7%. Obviously, the $Al_aIn_bGa_{1-a-b}N/In_eGa_{1-e}N$ super-lattice structure can enhance the wall-plug efficiency of the nitride semiconductor LED device effectively.

Referring to FIG. 3C, as the operating current is increased by 100 mA, the blue-shifted wavelength in the nitride semiconductor LED device are respectively 8.3 nm (aluminum content is 6%), 7.4 nm (aluminum content is 9%), 7 nm (aluminum content is 12%). When the quantum barrier layer is constituted by a single layer of GaN (that is, the base), the blue-shifted wavelength thereof is 8.5 nm. Clearly, the $Al_aIn_bGa_{1-a-b}N/In_eGa_{1-e}N$ super-lattice structure can reduce the blueshifted wavelength of the nitride semiconductor LED device effectively.

Figure 4:
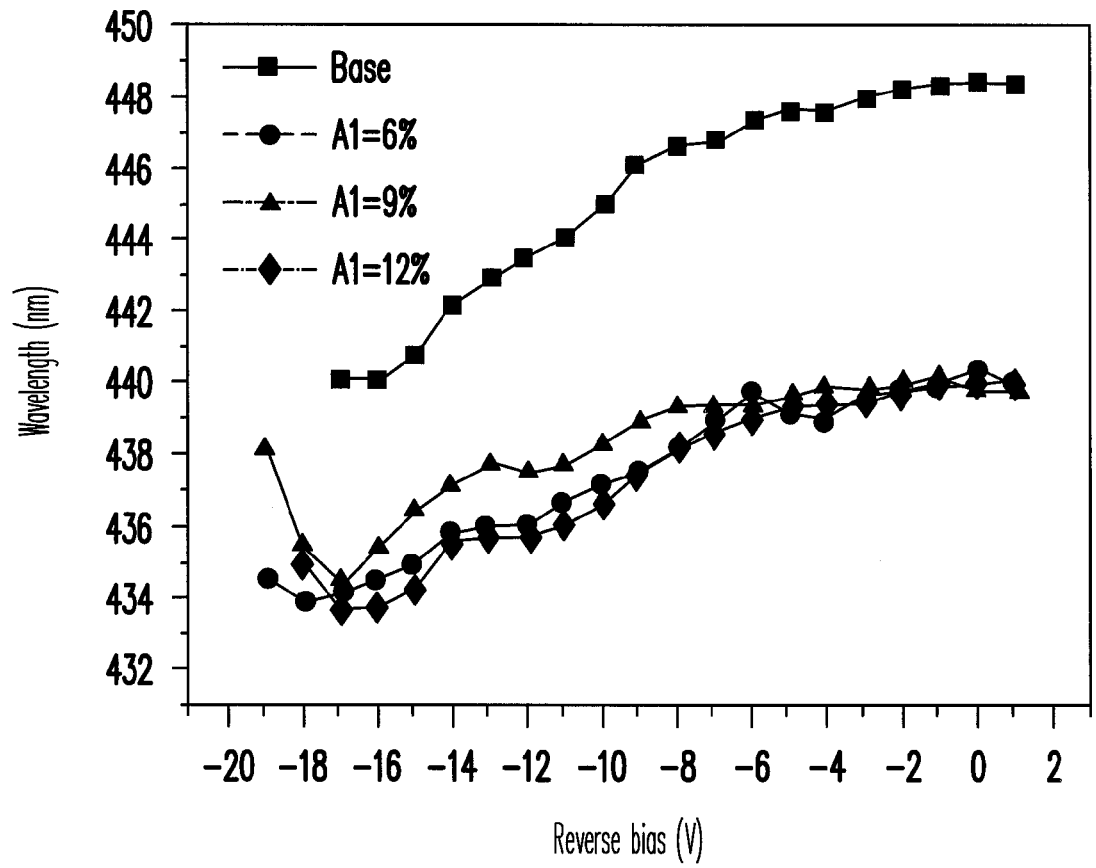
FIG. 4 shows a diagram depicting a relationship between reverse bias corresponding to different aluminum contents (a values) and wavelength.

FIG. 4 shows a diagram depicting a relationship between reverse bias corresponding to different aluminum contents (a values) and wavelength. Referring to FIG. 4, whether the piezoelectric field is changed can be observed from voltage values corresponding to wavelength reversion. As depicted in FIG. 4, when the quantum barrier layer is constituted by a single layer of GaN (that is, the base), the voltage value corresponding to the reverse point can not be measured. When the super-lattice structure of the quantum barrier layer is constituted by an $Al_aIn_bGa_{1-a-b}N$ layer and an $In_eGa_{1-e}N$ layer that are periodically stacked, the voltage values corresponding to the reverse point are −18 V (aluminum content is 6%) and −17 V (aluminum content is 9%, 12%) respectively. Obviously, when the super-lattice structure of the quantum barrier layer is constituted by the $Al_aIn_bGa_{1-a-b}N$ layer and the $In_eGa_{1-e}N$ layer that are periodically stacked, the piezoelectric field decreases and is related to the amount of aluminum added.

In summary, the quantum barrier layer having a super-lattice structure including the quaternary nitride semiconductor facilitates to release the strain of the active layer. Consequently, the piezoelectric effect can be inhibited effectively, the quality of the lattices subsequently formed in the quantum well can be enhanced, and the occurrence of current leakage can be reduced. Further, comparing to the quantum barrier layer constituted by a single layer of GaN, the quantum barrier layer constituted by the $Al_aIn_bGa_{1-a-b}N$ layer and the $In_eGa_{1-e}N$ layer is capable of providing a higher band gap difference (i.e. 0.2 eV to 2 eV) with the quantum well layer for increasing carrier confinement and increasing the possibility of electron-hole pair recombination, thereby enhancing internal quantum efficiency.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A nitride semiconductor light emitting diode (LED) device, comprising:
   an N-type doped nitride semiconductor layer;
   an active layer disposed on the N-type doped nitride semiconductor layer, comprising at least one quantum well structure, wherein the quantum well structure comprises two quantum barrier layers and a quantum well sandwiched between the quantum barrier layers, at lease one of the quantum barrier layers is a super-lattice structure comprising a quaternary nitride semiconductor, the super-lattice structure is constituted by an $Al_aIn_bGa_{1-a-b}N$ layer and an $In_eGa_{1-e}N$ layer which are periodically stacked, where $0.01 \leq a \leq 0.5$ and a+b<1; and
   a P-type doped nitride semiconductor layer disposed on the active layer.

2. The nitride semiconductor LED device as claimed in claim 1, wherein $0.015 \leq b \leq 0.15$.

3. The nitride semiconductor LED device as claimed in claim 2, wherein $0.05 \leq e \leq 0.07$.

4. The nitride semiconductor LED device as claimed in claim 1, wherein a number of layers in the periodically stacked super-lattice structure is more than or equal to 2.

5. The nitride semiconductor LED device as claimed in claim 1, wherein a thickness of the active layer ranges from 3 nm to 500 nm.

6. The nitride semiconductor LED device as claimed in claim 1, further comprising a strain release layer located between the N-type doped nitride semiconductor layer and the active layer, wherein a material of the strain release layer comprises a stacked structure constituted by an $In_mGa_{1-m}N$ layer and a GaN layer, wherein in ranges from 0.01 to 0.3.

7. A nitride semiconductor light emitting diode (LED) device, comprising:
   an N-type doped nitride semiconductor layer;
   an active layer disposed on the N-type doped nitride semiconductor layer, comprising at least one quantum well structure, wherein the quantum well structure comprises two quantum barrier layers and a quantum well sandwiched between the quantum barrier layers, at least one of the quantum barrier layers is a super-lattice structure comprising a quaternary nitride semiconductor, the super-lattice structure is constituted by an $Al_aIn_b$ $Ga_{1-a-b}N$ layer and an $In_eGa_{1-e}N$ layer which are periodically stacked, where $0.03 \leq a \leq 0.15$ and $a+b<1$; and a P-type doped nitride semiconductor layer disposed on the active layer.

8. The nitride semiconductor LED device as claimed in claim 7, wherein $0.015 \leq b \leq 0.15$.

9. The nitride semiconductor LED device as claimed in claim 8, wherein $0.05 \leq e \leq 0.07$.

10. The nitride semiconductor LED device as claimed in claim 7, wherein a number of layers in the periodically stacked super-lattice structure is more than or equal to 2.

11. The nitride semiconductor LED device as claimed in claim 7, wherein a thickness of the active layer ranges from 3 nm to 500 nm.

12. A nitride semiconductor LED device, comprising:
an N-type doped nitride semiconductor layer;
an active layer disposed on the N-type doped nitride semiconductor layer, comprising at least one quantum well structure, wherein the quantum well structure comprises two quantum barrier layers and a quantum well sandwiched between the quantum barrier layers, at least one of the quantum barrier layers is a super-lattice structure comprising a quaternary nitride semiconductor, the super-lattice structure is constituted by an $Al_aIn_bGa_{1-a-b}N$ layer and an $In_eGa_{1-e}N$ layer which are periodically stacked, where $0.08 \leq a \leq 0.095$ and $a+b<1$; and a P-type doped nitride semiconductor layer disposed on the active layer.

13. The nitride semiconductor LED device as claimed in claim 12, wherein $0.015 \leq b \leq 0.15$.

14. The nitride semiconductor LED device as claimed in claim 12, wherein $0.05 \leq e \leq 0.07$.

15. The nitride semiconductor LED device as claimed in claim 12, wherein a number of layers in the periodically stacked super-lattice structure is more than or equal to 2.

16. The nitride semiconductor LED device as claimed in claim 12, wherein a thickness of the active layer ranges from 3 nm to 500 nm.

* * * * *